(12) United States Patent
Lee et al.

(10) Patent No.: US 9,735,295 B2
(45) Date of Patent: Aug. 15, 2017

(54) ELECTRODE HAVING EXCELLENT LIGHT TRANSMITTANCE, METHOD FOR MANUFACTURING SAME, AND ELECTRONIC ELEMENT INCLUDING SAME

(71) Applicant: GWANGJU INSTITUTE OF SCIENCE AND TECHNOLOGY, Gwangju (KR)

(72) Inventors: Kwang Hee Lee, Gwangju (KR); Su Hyun Jung, Gwangju (KR); Hong Kyu Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/027,184

(22) PCT Filed: Aug. 25, 2014

(86) PCT No.: PCT/KR2014/007868
§ 371 (c)(1),
(2) Date: Apr. 4, 2016

(87) PCT Pub. No.: WO2015/050320
PCT Pub. Date: Apr. 9, 2015

(65) Prior Publication Data
US 2016/0233357 A1    Aug. 11, 2016

(30) Foreign Application Priority Data
Oct. 4, 2013   (KR) .......................... 10-2013-0118543

(51) Int. Cl.
*H01L 21/3205*    (2006.01)
*H01L 33/44*    (2010.01)
(Continued)

(52) U.S. Cl.
CPC .. *H01L 31/022466* (2013.01); *H01L 31/1884* (2013.01); *H01L 51/0021* (2013.01);
(Continued)

(58) Field of Classification Search
CPC ......... H01L 21/28061; H01L 21/32051; H01L 33/44
(Continued)

(56) References Cited

U.S. PATENT DOCUMENTS 7,211,509 B1 * 5/2007 Gopinath ............ C23C 16/0272
257/E21.17
8,017,252 B2 * 9/2011 Iwaki .................. H01L 51/5052
257/40
(Continued)

FOREIGN PATENT DOCUMENTS

JP    2005-129496 A    5/2005
KR    10-2001-0068549 A    7/2001
(Continued)

OTHER PUBLICATIONS

International Search Report mailed Oct. 10, 2014 corresponding to International Application No. PCT/KR2014/007868.
(Continued)

*Primary Examiner* — George Fourson, III
(74) *Attorney, Agent, or Firm* — Hauptman Ham, LLP

(57) ABSTRACT

An electronic device with an electrode having a superior light transmittance and including a substrate, an amine group-containing compound layer formed on the substrate, and a metal layer formed on the amine group-containing compound layer is provided. In accordance with the present invention, the electrode is easily manufactured when a solution process is used, has performances of a light transmittance, a sheet resistance, and flexibility higher than those
(Continued)

of a typical ITO transparent electrode, and a manufacturing cost of the electrode may be reduced.

15 Claims, 15 Drawing Sheets

(51) Int. Cl.
  *H01L 31/0224* (2006.01)
  *H01L 31/18* (2006.01)
  *H01L 51/52* (2006.01)
  *H01L 51/56* (2006.01)
  *H01L 51/00* (2006.01)
  *H01L 51/44* (2006.01)
  *H01L 21/28* (2006.01)

(52) U.S. Cl.
  CPC ........ *H01L 51/442* (2013.01); *H01L 51/5203* (2013.01); *H01L 51/5215* (2013.01); *H01L 51/5234* (2013.01); *H01L 51/56* (2013.01); *G06F 2203/04103* (2013.01); *H01L 21/28061* (2013.01); *H01L 21/32051* (2013.01); *H01L 33/44* (2013.01); *H01L 51/5281* (2013.01); *Y02E 10/549* (2013.01)

(58) Field of Classification Search
  USPC .......................................... 257/734; 438/686
  See application file for complete search history.

(56) References Cited

U.S. PATENT DOCUMENTS

| | | | | |
|---|---|---|---|---|
| 9,252,381 | B2* | 2/2016 | Ueno | H01L 51/506 |
| 2006/0152146 | A1* | 7/2006 | Funahashi | C07C 211/61 |
| | | | | 313/504 |
| 2007/0128465 | A1* | 6/2007 | Liu | H01L 51/5048 |
| | | | | 428/689 |
| 2011/0186831 | A1* | 8/2011 | Mizuki | C07C 211/61 |
| | | | | 257/40 |
| 2012/0032121 | A1* | 2/2012 | Higashimura | B22F 1/0025 |
| | | | | 252/514 |
| 2013/0105770 | A1* | 5/2013 | Pschenitzka | H01L 31/0232 |
| | | | | 257/40 |
| 2013/0220412 | A1* | 8/2013 | Hatton | H01L 51/0021 |
| | | | | 136/256 |
| 2014/0124763 | A1* | 5/2014 | Funahashi | H01L 51/0067 |
| | | | | 257/40 |
| 2015/0060796 | A1* | 3/2015 | Kim | H01L 51/0073 |
| | | | | 257/40 |
| 2016/0095212 | A1* | 3/2016 | Lee | H01L 21/26506 |
| | | | | 174/251 |

FOREIGN PATENT DOCUMENTS

| KR | 10-2008-0073318 A | 8/2008 |
|---|---|---|
| KR | 10-1204289 B1 | 11/2012 |
| KR | 10-2013-0027991 A | 3/2013 |

OTHER PUBLICATIONS

Park Kie Jin et al., "Atomic layer deposition of Ru onto organic monolayers: Shifting metal effective work function using monolayer structure", Journal of Vacuum science and technology: part A, AVS/AIP, Melville, NY., US, vol. 30, No. 1, Jan. 6, 2012 (Jan. 6, 2012), pp. 1A162-1A162, XPO12160381, ISSN: 0734-2101, DOI: 10.1116/1.3671938 [retrieved on Jan. 6, 2012] pp. 01A162-1, col. 2—pp. 01A162-2, col. 1.

European Search Report dated Sep. 16, 2016 for Application No. EP 14 85 0547.2 (PCT/KR2014/007868).

* cited by examiner

ELECTRODE HAVING EXCELLENT LIGHT TRANSMITTANCE, METHOD FOR MANUFACTURING SAME, AND ELECTRONIC ELEMENT INCLUDING SAME

CROSS REFERENCE TO RELATED APPLICATION

This application claims the priority of Korean Patent Application No. 10-2013-0118543, filed on Oct. 4, 2013 in the KIPO (Korean Intellectual Property Office). Further, this application is the National Phase application of International Application No. PCT/KR2014/007868 filed on Aug. 25, 2014, which designated the United States and was published in Korea.

TECHNICAL FIELD

The present invention relates to an electrode having superior light transmittance, a method for manufacturing the same, and an electronic device including the same. More particularly, the present invention relates to a multilayer structured electrode having an improved light transmittance to be applicable to a transparent electrode.

BACKGROUND ART

Recently, as growing for aspirations of ubiquitous ear, research for next generation electronic devices are being conducted globally and actively. According to acceleration of research on an organic display, an organic solar cell, and the like, importance to development of a transparent electrode material is raised so as to commercialize these devices. A transparent electrode for the next generation electronic devices should satisfy a mechanical flexibility, a superior optical property (light transmittance>85%, @550 nm), and a superior electrical property (sheet resistance<15Ω/□).

As disclosed in Korean Laid-Open Patent Application No. 2013-0027991 and the like, a transparent electrode being currently and widely used is an indium tin oxide (ITO) thin film in which an indium oxide is doped with a tin oxide. The ITO, however, has problems as follow.

(1) When an ITO transparent electrode is formed on a glass substrate, a high temperature thermal treatment over 300° C. is possible to obtain a crystalline ITO thin film having a low sheet resistance, or otherwise, when the ITO transparent electrode is formed on an organic substrate such as a polyethylene terephthalate (PET), a thermal treatment is performed below 200° C. so as to prevent a deformation or damage to an organic material such that there is a problem in which an amorphous ITO thin film having high sheet resistance is formed.

(2) Unlike a metal material and a polymeric material, an ITO transparent electrode is easily cracked due to a bending of a substrate to cause difficulty in application to devices (3) Owing to an explosive increase of demanding for an ITO transparent electrode for use in a flat panel display, a mobile device, a touch panel, and the like, there are problems in which the cost of indium, which is a main raw material of the ITO transparent electrode, has steadily increased and cost competitiveness is weakened due to limited reserves.

(4) Upon formation of a thin film, a process condition requiring a high temperature and a high vacuum acts one reason to cause a cost increase of an ITO transparent electrode.

In order to substitute for an ITO transparent electrode and to obtain a flexible transparent electrode, a transparent electrode can be formed at a low temperature for enabling a manufacture of the transparent electrode on a flexible substrate while maintaining "flexibility" in addition to "high transmittance" and "low sheet resistance." For developing a transparent electrode satisfying these conditions, researches across various fields including a conductive polymer, an oxide-metal-oxide (OMO) structure, a graphene, an ultra-thin metal film, and the like have actively conducted, but, up to this day, a transparent electrode satisfying all of mechanical, optical, and electrical properties has been not developed.

DISCLOSURE

Technical Problem

In accordance with one aspect of the present invention, an electrode having an improved wettability of a metal to a substrate as well as a high light transmittance and a low sheet resistance, and an electronic device including the same are provided. Also, flexibility may be further included.

In accordance with another aspect of the present invention, a method for manufacturing an electrode having a superior light transmittance is provided to perform a process at a relatively low temperature and to enable a mass production.

However, problems to be solved by the present invention are not limited to the aforementioned problems, and another problem not mentioned above may be clearly understood by those skilled in the art from the following description.

Technical Solution

To attain the object described above, a first aspect of the present invention provides an electrode having a superior light transmittance and including a substrate, an amine group-containing compound layer formed on the substrate, and a metal layer formed on the amine group-containing compound layer.

In one implementation example, an anti-reflection layer formed on the metal layer may be further included, but it is not limited thereto.

In another implementation example, a metal oxide layer provided between the substrate and the amine group-containing compound layer may be further included, but it is not limited thereto.

A second aspect of the present invention provides an electronic device including an electrode having a superior light transmittance.

A third aspect of the present invention provides a method for manufacturing an electrode having a superior light transmittance, including forming an amine group-containing compound layer on a substrate, and forming a metal layer on the amine group-containing compound layer.

Advantageous Effects

In accordance with the present invention, the electrode is easily manufactured when a solution process is used, has performances of a light transmittance and a sheet resistance (transmittance>85%, @550 nm and sheet resistance<15Ω/□) and flexibility substitutable for those of a typical ITO transparent electrode, and a manufacturing cost of the electrode may be reduced.

BEST MODE

Hereinafter, in order to easily implement embodiments disclosed herein by those skilled in the art, an electrode having a superior light transmittance, a method for manufacturing the same, and an electronic device including the same of the present invention will be described in detail with reference to the accompanying drawings.

Figure 1:
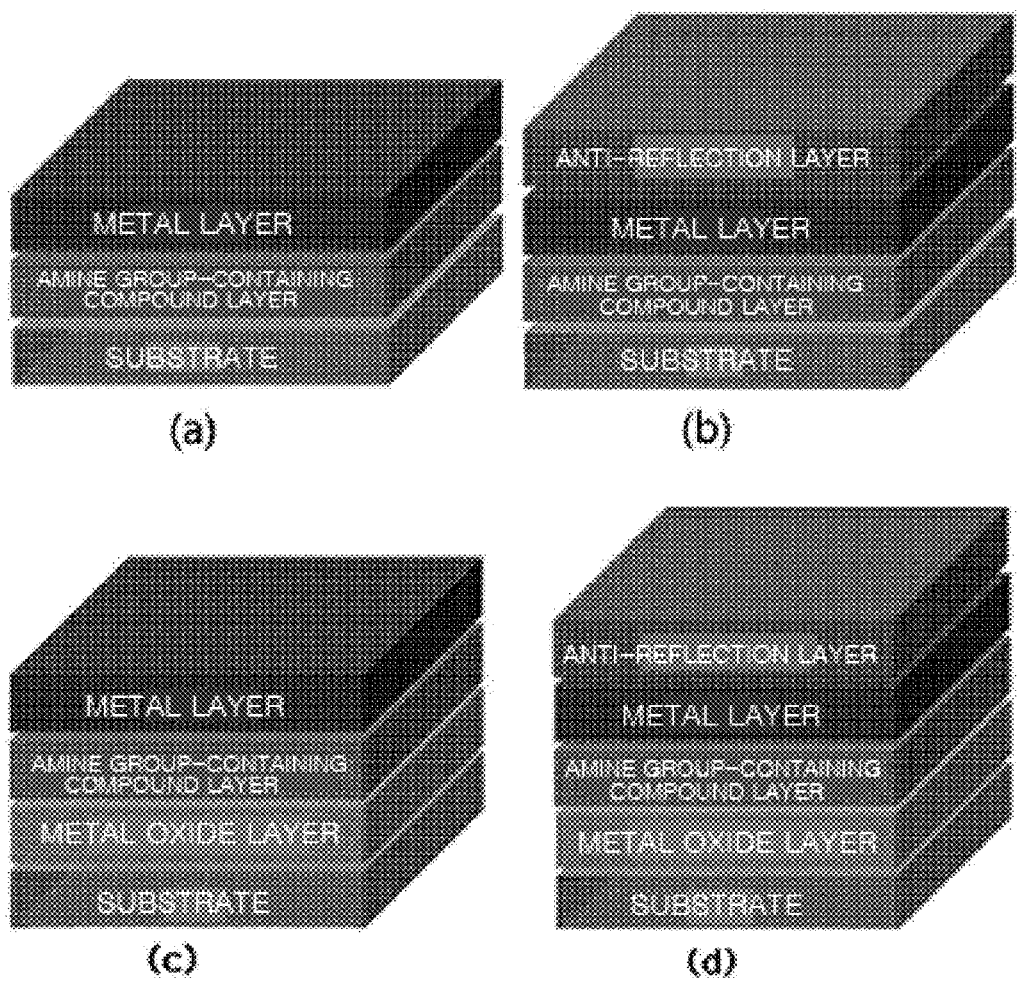
FIG. 1 shows four examples of an electrode configuration according to an embodiment of the present invention.

The present invention relates to an electrode having a superior light transmittance and a method for manufacturing the same, and more particularly, to a multilayer structured ultra-thin metal film. An ultra-thin metal film having a superior light transmittance of the present invention may be comprised of a substrate/amine group-containing compound layer/metal layer, a substrate/amine group-containing compound layer/metal layer/anti-reflection layer, a substrate/metal oxide layer/amine group-containing compound layer/metal layer, or a substrate/metal oxide layer/amine group-containing compound layer/metal layer/anti-reflection layer. Illustrative structural diagrams of electrodes are respectively shown in FIG. 1.

Among various replaceable electrodes, the ultra-thin film may use properties of superior mechanical flexibility and high electrical conductivity of a metal.

An electrode using the ultra-thin metal film is formed by evaporating a metal thin film having a thin thickness in the range of several to tens of nanometers on a substrate. However, since wettability of a metal to the substrate is not good, there is a difficulty in forming a uniform thin film. With reference to (a) of FIG. 10, since a metal-metal binding force is greater than a metal-substrate binding force, a metal thin film is formed by a mode, so-called "an island growth mode" in which metal nuclei are agglomerated to tridimensionally form a metal island, not by uniformly forming metal nuclei on a surface of the substrate to growth a thin film.

Figure 3:
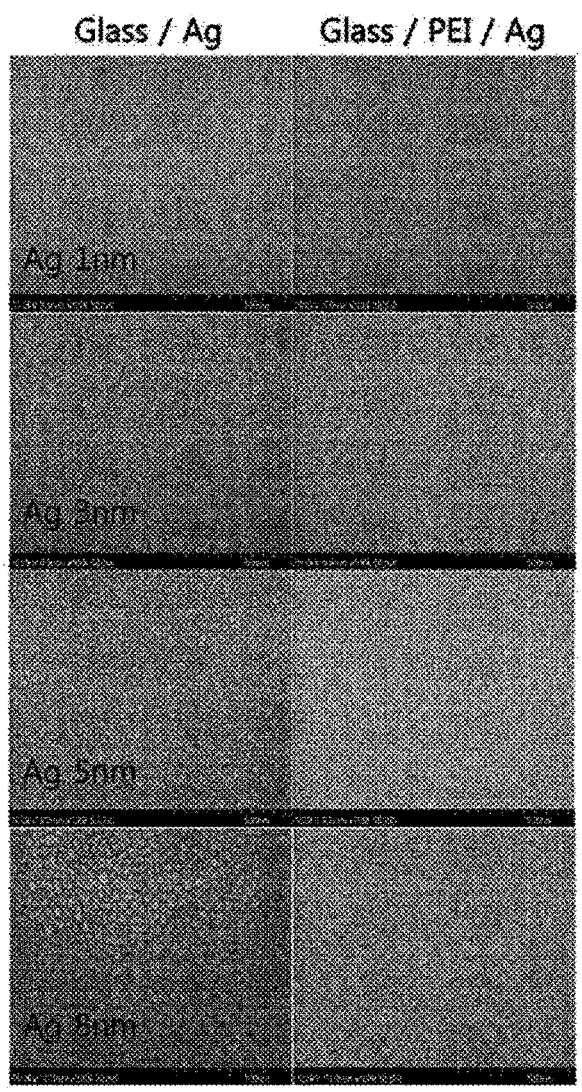
FIG. 3 shows SEM images according to a variation of a Ag thickness for Ag and polyethyleneimine (PEI)/Ag layered on the glass substrate, respectively.

In the metal thin film of several nanometers thickness formed in the island growth mode, a continuous network is not formed and a surface of an electrode is roughened to cause increase a sheet resistance. In addition, since a plasmonic effect generated due to a formation of the metal island, there is a problem in which a visible light region is absorbed to lower transmittance. This phenomenon can be seen from a graph of FIG. 4, and a peak due to a plasmonic effect is observed near 550 nm when only Ag is evaporated on a glass substrate and also it can be seen that transmittance at the peak is considerably low. In addition, as can be seen from the photographs of FIG. 3, although a size of a metal island is gradually larger to form a continuous network and to drastically reduce a sheet resistance when a metal is evaporated as thick as possible, there is a problem in which transmittance is increasingly lowered.

To address the aforementioned problems of such an ultra-thin metal film, the present invention introduces an amine group-containing compound layer before forming a metal thin film to improve wettability of a metal to a substrate, thereby improving a performance of an electrode.

Figure 11:
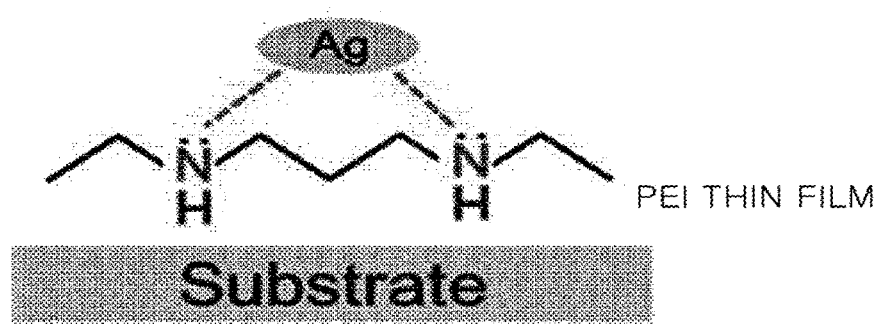
FIG. 11 is a mimetic diagram illustrating a binding relationship between a metal layer (Ag) and a polymer containing amine groups (PEI) according to one embodiment of the present invention.

Through a reaction between a metal of a metal layer formed after applying an amine group-containing compound on a substrate and an amine group, the metal may be fixed to the substrate. In FIG. 11, a binding relationship between the metal Ag contained in the metal layer and an amine group-containing polymer (PEI) as a kind of an amine group-containing compound is illustrated. In other words, agglomeration phenomenon of nuclei of the metal Ag is prevented due to a strong chemical binding between the amine group-containing polymer on the substrate and the metal, such that nuclei are uniformly and densely formed in comparison with a metal thin film without introducing the amine group polymer. This result is construed due to a combined reaction of high surface energy of the amine group-containing polymer and the chemical binding between the amine group and the metal.

Figure 10:
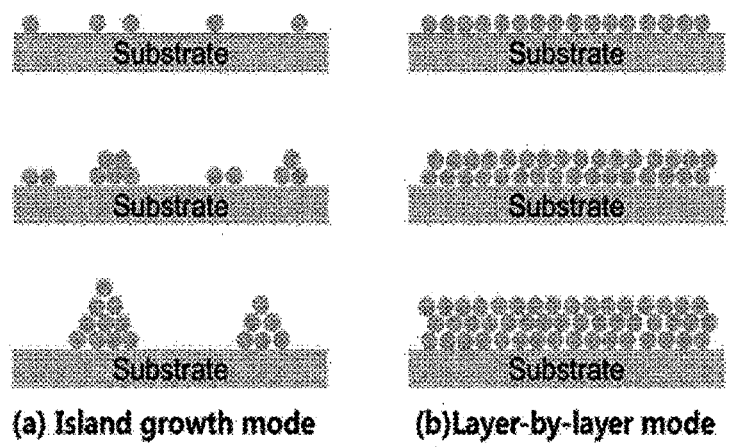
FIG. 10 is a view illustrating a formation of a thin film in an island growth mode upon evaporating a metal onto a substrate (a) and the thin film in a layer-by-layer mode upon evaporating a metal onto the substrate (b).

As a result, the metal thin film may be formed on the amine group-containing compound layer in a relatively flat form through a layer-by-layer growth mode shown in (b) of FIG. 10 rather than the island growth mode.

Figure 2:
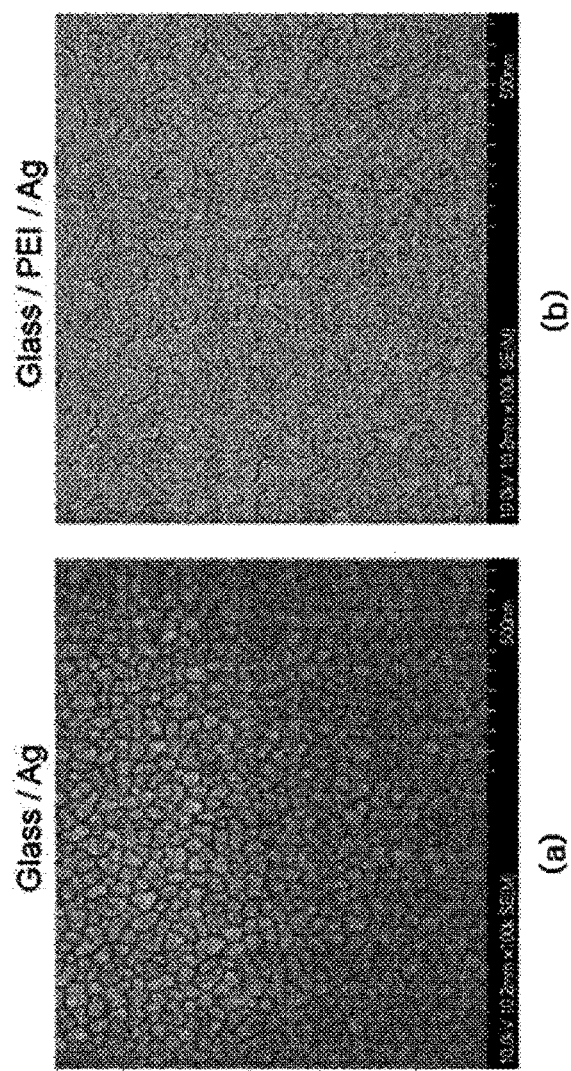
FIG. 2 shows a scanning electron microscope (SEM) image of a silver thin film formed on a glass substrate according to one comparative example of the present invention (a) and a SEM image for a polymer containing amine groups interposed between a glass substrate and a silver film according to one embodiment of the present invention (b).

As can be seen from the photographs of FIG. 2, a surface having an island shape may be observed when the metal Ag is simply evaporated on the glass substrate (a), and a surface having a continuous network shape may be observed when PEI as an amine group-containing compound is applied on the glass substrate and then the metal Ag is evaporated on the PEI (b). This can be seen from SEM results of FIG. 3 measuring variation of a surface shape of a Ag thin film according to a thickness.

In the case of the Glass/Ag not introducing the amine group-containing compound layer, the thin film is formed in "the island growth mode" as an evaporation thickness of a silver thin film is getting thicker such that nuclei of silver are agglomerated to form a metal island and then the metal island is getting greater.

On the other hand, in case of the Glass/PEI/Ag introducing the amine group-containing compound layer, even though the evaporation thickness of the silver thin film is getting thicker, the metal island is not formed and a silver metal is grown in the form of a thin film. Therefore, by introducing the amine group-containing compound layer between the substrate and the metal thin film, a growth method of the silver thin film may be changed from "the island growth method" to "the layer-by-layer growth mode."

As the growth method of the silver thin film is changed to "the layer-by-layer growth mode", an electrode having a sleeker surface and an improved performance of a high transmittance and a low sheet resistance may be manufactured in comparison with the Glass/Ag.

An inorganic substrate or an organic substrate may be used as the substrate.

The inorganic substrate may be made of glass, quartz, $Al_2O_3$, SiC, Si, GaAs, or InP, but it is not limited thereto. The organic substrate may be selected from Kepton foil, polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), and cellulose acetate propionate (CAP), but it is not limited thereto. The electrode of the present invention pursuits a superior light transmittance so that it may be more preferable that the inorganic substrate and the organic substrate are made of a transparent material.

When an organic substrate is introduced, flexibility of an electrode may be increased.

A non-restrictive example of the amine group-containing compound may include alkylamine available for having substituents, cycloalkylamine available for having substituents, arylamine available for having substituents, polymer containing amine groups derived from these amines, or a combination of two or more polymers containing the amine groups, but it is not limited thereto.

In particular, the non-restrictive example of the amine group-containing compound may include amine selected from a group consisting of methylamine, ethylamine, n-propylamine, isopropylamine, n-butylamine, isobutylamine, isoamylamine, n-hexylamine, 2-ethylhexylamine, n-heptylamine, n-octylamine, isoctylamine, nonylamine, decylamine, dodecylamine, hexadecylamine, octadecylamine, docodecylamine, cyclopropylamine, cyclopentylamine, cyclohexylamine, arylamine, hydroxyamine, ammonium hydroxide, methoxyamine, 2-ethanolamine, methoxyethylamine, 2-hydroxypropylamine, methoxypropaneamine, cyanoethylamine, ethoxyamine, n-butoxyamine, 2-hexyloxyamine, methoxyethoxyethylamine, methoxyethoxyethoxyethyl amine, diethylamine, dipropylamine, diethanolamine, hexamethyleneamine, morpholine, piperidine, piperazine, ethylenediamine, propylenediamine, hexamethylenediamine, triethylenediamine, 2,2"-(ethylenedioxy)bis(ethylamine), triethylamine, triethanolamine, pyrrole, imidazole, pyridine, aminoacetaldehyde dimethyl acetal, 3-aminopropyltrimethoxysilane, 3-aminopropyltriethoxysilane, aniline, anisidine, aminobenzonitrile, and benzylamine, polymers containing amine groups derived from these amines, or a combination of two or more polymers containing the amine groups, but it is not limited thereto.

Alternatively, the polymer containing the amine groups may be understood as a concept including a conjugated polymer containing all kinds of amine groups, or a non-conjugated polymer such as PEI, polylysine (PLS), polyallylamine (PAA), or the like.

Forming the amine group-containing compound layer on the substrate may include, for example, applying or self-assembling an amine group-containing compound on the substrate, but it is not limited thereto.

When being applied through a solution process, the amine group-containing compound may be dissolved in a solvent such as deionized water or alcohol to be applied. Concentration of such a solution and a kind of the solvent may be adequately adjusted as necessary.

The amine group-containing compound layer may be formed by applying the solution containing the amine group-containing compound on the substrate through a solution process including spin-coating, roll coating, spray coating, flow coating, ink-jet printing, nozzle printing, dip coating, electrophoretic deposition, tape casting, screen printing, pad printing, doctor blade coating, gravure printing, gravure offset printing, or Langmuir-Blodgett process, or through sputter deposition, electron beam evaporation, thermal evaporation, and chemical vapor deposition in addition to the aforementioned solution processes, but it is not limited thereto.

Thereafter, a metal layer is formed on the amine group-containing compound layer which has been formed.

At this point, a metal available for use may include a transition metal, but it is not limited thereto. For example, the metal may be a transition metal selected from a group consisting of Ag, Cu, Au, Al, Ce, Pr, Nd, Pm, Sm, Eu, Gd, Tb, Dy, Ho, Er, Tm, Yb, Lu, Sc, Ti, V, Cr, Mn, Fe, Co, Ni, Zn, Y, Zr, Nb, Mo, Tc, Ru, Rh, Pd, Cd, In, Sn, Hf, Ta, W, Re, Os, Ir, Pt, Tl, Pb, Bi, Ga, Ge, Sb, Ac, Th, and a combination thereof.

The metal layer may be formed through a method including sputter deposition, electron beam evaporation, thermal evaporation, chemical vapor deposition, or an applying method using a solution process.

When the metal layer is formed using the solution process, a metal-containing solution may be manufactured by dissolving a metal in a suitable solvent and concentration of the solution may be adequately adjusted by a skilled person in the art within a range appliable on the amine group-containing compound. The solvent used in manufacturing the metal-containing solution may include an aqueous solvent, a non-aqueous solvent, or a mixed solvent thereof. For example, the solvent may include a type of alcohol such as water, methanol, ethanol, isopropanol, and butanol; a type of glycol such as ethylene glycol and glycerin; a type of acetate such as ethyl acetate, butyl acetate, and carbitol acetate; a type of ether such as diethyl ether, tetrahydrofuran, and dioxane; a type of ketone such as methyl ethyl ketone and acetone; a type of hydrocarbon such as hexane and heptane; aromatic series such as benzene and toluene; a halogen-substituted solvent such as chloroform or methylene chloride; and a mixed solvent made of a combination thereof, but it is not limited thereto.

A method for applying the metal-containing solution on the amine group-containing compound layer is the same as the method for applying the amine group-containing compound solution on the substrate, and thus a repetitive description thereof will be omitted below.

Also, a thickness of the metal layer may be adjusted in the range of 3 to 20 nm so as to form an electrode, but it is not limited thereto.

In accordance with the present invention, superior light transmittance and sheet resistance of an electrode may be obtained only with a configuration of a substrate/amine group-containing compound layer/metal layer, and an anti-reflection may be additionally included on the metal layer so as to obtain an excellent performance.

It may be construed that the anti-reflection layer provides an anti-reflection effect by a refractive index of the compound such that an optical property is strengthened by means of the anti-reflection effect to increase transparency of the electrode.

A conductive polymer may be used in the anti-reflection layer, but it is not limited thereto, and electrolytes or other organic materials may be used therein.

The conductive polymer used as the anti-reflection layer may include a conductive polymer available for having a hetero element selected from a group consisting of nitrogen, oxygen, sulfur, carbon, and a combination thereof, but it is not limited thereto. For example, the conductive polymer may include one selected from polyaniline, polythiophene, polyethylenedioxythiophene (PEDOT), polyimide, polystyrenesulfonate (PSS), polypyrrole, polyacetylene, poly(p-phenylene), poly(p-phenylene sulfide), poly(p-phenylene vinylene), (Polythiophene Poly(thienylene vinylene)), poly (3,4-ethylenedioxythiophene)poly(styrenesulfonate) (PEDOT:PSS), and a combination thereof, but it is not limited thereto.

A polyelectrolyte of the electrolytes used as the anti-reflection layer may include, for example, poly[(9,9-bis(3'-(N,N-dimethylamino)propyl)-2,7-fluorene)-alt-2,7-(9,9-di-octylfluorene) (PFN), poly(9,9-bis(4'-sulfonatobutyl) (fluorine-alt-co-1,4-phenylene (PFP), poly(styrenesulfonic acid) (PSS), poly(p-quaterphenylene-2,2'-dicarboxylic acid), and the like, and a monoelectrolyte may include, for example, diphenyl fluorene derivative (DPF), tetrakis(1-imidazolyl)borate, Bim4-, and the like.

A method for forming the anti-reflection layer is the same as the method for applying the amine group-containing compound solution on the substrate, and thus a repetitive description thereof will be omitted below.

Also, in accordance with the present invention, a metal oxide layer may be additionally included between the substrate and the amine group-containing compound layer of each of the electrodes comprised of the substrate/amine group-containing compound layer/metal layer and the substrate/amine group-containing compound layer/metal layer/anti-reflection layer.

By introducing the metal oxide layer between the substrate and the amine group-containing compound layer, an increase of a lifespan of the electrode may be expected. In addition, since the metal oxide is an amphiphilic substance having hydrophobicity and wettability, it may serve as an adhesive on not only a wettable substrate but also a hydrophobic substrate to enable the electrode to be formed easily.

The metal oxide composing the metal oxide layer may include all kinds of a metal oxide having an amphiphilic property, for example, such as titanium sub-oxide (TiOX), titanium oxide (TiO2), zinc oxide (ZnO), tungsten oxide (W2O3, WO2, and WO3), molybdenum oxide (MoO2 and MoO3), molybdenum sub-oxide (MoOX), and the like. These substances may be manufactured to be a thin film through sputter deposition, thermal evaporation, or a solution process using a substance synthesized in a sol-gel form.

In accordance with the present invention, an electronic device including the multilayer structured electrode may be also provided. In other words, the electrode according to the present invention may be usefully applicable to an electrode, specifically, an transparent electrode in the fields such as a solar cell, a secondary cell or fuel cell, a plasma display panel (PDP), a thin film transistor liquid crystal display (TFT-LCD), an organic light emitting diode (OLED), an organic TFT (OTFT), and the like.

In particular, if a metal ink of high quality is developed and then is grafted into a low-cost manufacturing method such as a printing method, a manufacturing cost may be drastically reduced such that the electrode according to the present invention may be evaluated as one of transparent electrodes substituting for the ITO.

Hereinafter, the present invention will be described in detail with reference to embodiments. It should be understood that embodiments to be described may be merely illustrative examples for describing the present invention in detail, and the embodiments to be disclosed herein, therefore, are not to be taken in a sense for limiting the scope of the present invention.

Embodiments

1. Manufacturing Process of Electrode 1-1. Substrate Cleaning

The substrate is cleaned by sequentially dipping in deionized water, acetone, and isopropyl alcohol and simultaneously performing an ultrasonic treatment during 20 minutes per each solution.

1-2. Substrate Drying

The cleaned substrate is dried in an oven maintained at a temperature of 60° C.

1-3. Ultraviolet (UV)-Ozone Treatment of Substrate

The dried substrate is subject to a UV-ozone treatment using a UV-ozone generator during 10 minutes. This process is performed so as to uniformly coat an amine group-containing compound layer which is to be formed in the following process.

1-4. Manufacture of Amine Group-Containing Compound Layer

Under a humidity condition equal to or less than 10%, a solution in which PEI is dissolved in deionized water at a concentration of 0.3 wt % is applied on the dried substrate using a spin-coating method to manufacture a PEI thin film. A thickness of the PEI thin film is formed with tens of nanometers. At this point, the coating method and the amine group-containing compound, the solvent of the solution, and the concentration used therein may be changed.

1-5. Thermal Treatment Process

Under a humidity condition equal to or less than 10%, the substrate on which the PEI thin film has been formed is subject to a drying process using a hot plate during 20 minutes at a temperature of 100° C. At this point, the drying method and the temperature may be changed according to conditions.

1-6. Manufacture of Ag Thin Film

A Ag thin film is formed with a thickness of 8 nm on the PEI thin film using a thermal evaporation method. At this point, the method of forming the thin film may be changed.

1-7. Manufacture of Anti-Reflection Layer

Using a spin-coating method, a PEDOT:PSS thin film is manufactured using a PEDOT:PSS solution as a kind of a conductive polymer. A thickness of the PEDOT:PSS thin film is formed with tens of nanometers. At this point, the coating method, the polymer used therein, and the thickness of PEDOT:PSS thin film may be changed.

1-8. Manufacture of Metal Oxide Layer

When a metal oxide layer is included in a configuration of the electrode, a metal oxide thin film is coated on the substrate using the solution process or various evaporation methods before the amine group-containing compound layer is manufactured. At this point, the UV-ozone treatment process of the substrate may be omitted.

2. Implementation of Electrode Manufacture 2-1. Use of Glass Substrate (1) Using the solution process, a PEI thin film is coated on a glass substrate and then a Ag metal thin film is coated on the PEI thin film to manufacture "Inventive Electrode 1."

(2) Using the solution process, a $TiO_x$ thin film is coated on the glass substrate and a PEI thin film is coated on the $TiO_x$ thin film to coat a Ag metal thin film on the PEI thin film once more, thereby manufacturing "Inventive Electrode 8."

(3) With a configuration of "Inventive Electrode 1", a PEDOT:PSS thin film is coated on the Ag metal thin film once more using the solution process to manufacture "Inventive Electrode 2."

(4) With the configuration of "Inventive Electrode 1", a PEN thin film is coated on the Ag metal thin film once more using the solution process to manufacture "Inventive Electrode 3."

(5) With the configuration of "Inventive Electrode 1", a DPF thin film is coated on the Ag metal thin film once more using the solution process to manufacture "Inventive Electrode 4."

(6) With a configuration of "Inventive Electrode 8", a PEDOT:PSS thin film is coated on the Ag metal thin film once more using the solution process to manufacture "Inventive Electrode 9."

(7) For comparing with "Inventive Electrode 1", "Inventive Electrode 2", "Inventive Electrode 3", "Inventive Electrode 4", "Inventive Electrode 8", and "Inventive Electrode 9", a Ag metal thin film is coated on the glass substrate to manufacture "Comparative Electrode 1."

2-2. Use of Polyethylene Naphthalate Substrate (1) Using the solution process, a PEI thin film is coated on a PEN substrate and then a Ag metal thin film is coated on the PEI thin film to manufacture "Inventive Electrode 5."

(2) Using the solution process, a $TiO_x$ thin film is coated on a PEN substrate and then a PEI thin film is coated on the $TiO_x$ thin film to coat a Ag metal thin film once more, thereby manufacturing "Inventive Electrode 10."

(3) With a configuration of "Inventive Electrode 5", a PEDOT:PSS thin film is coated on the Ag metal thin film using the solution process once more to manufacture "Inventive Electrode 6."

(4) With the configuration of "Inventive Electrode 5", a PEN thin film is coated on the Ag metal thin film using the solution process once more to manufacture "Inventive Electrode 7."

(5) With a configuration of "Inventive Electrode 10", a PEDOT:PSS thin film is coated on the Ag metal thin film using the solution process once more to manufacture "Inventive Electrode 11."

(6) For comparing with "Inventive Electrode 5", "Inventive Electrode 6", and "Inventive Electrode 7", a Ag metal thin film is coated on the PEN substrate to manufacture "Comparative Electrode 2."

(7) For comparing with "Inventive Electrode 10" and "Inventive Electrode 11", a TiOX thin film and a Ag metal thin film are sequentially coated on the PEN substrate using the solution process to manufacture "Comparative Electrode 3."

3. Performance Evaluation of Electrode 3-1. Use of Glass Substrate

In comparison with "Comparative Electrode 1" in which only the metal layer is formed on the glass substrate, "Inventive Electrode 1" manufactured with the PEI and the metal (Ag) layered on the glass substrate, "Inventive Electrode 2" manufactured with the conductive polymer layer (PEDOT:PSS) in addition to "Inventive Electrode 1", "Inventive Electrode 3" manufactured with the polyelectrolyte layer (PEN) in addition to "Inventive Electrode 1", and "Inventive Electrode 4" manufactured with the monoelectrolyte layer (DPF) in addition to "Inventive Electrode 1" show a low sheet resistance and a high transmittance.

Figure 4:
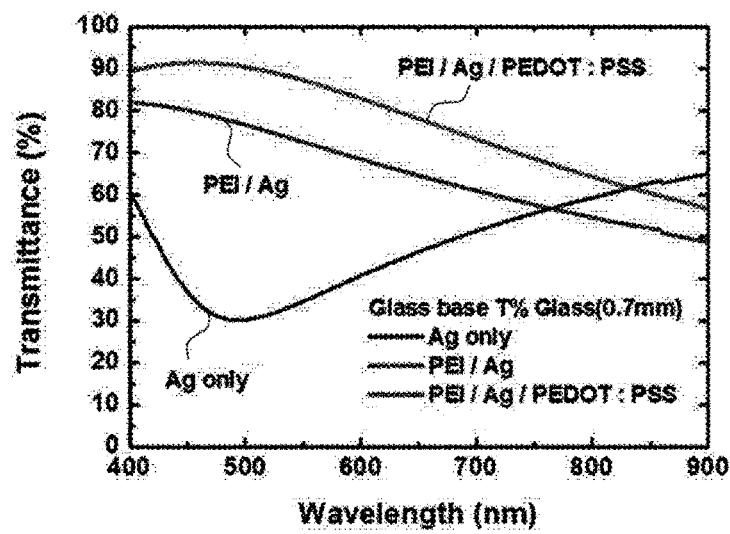
FIG. 4 shows a graph representing a light transmittance per wavelength for Ag, PEI/Ag, and PEI/Ag/PEDOT:PSS layered on the glass substrate, respectively.
Figure 7:
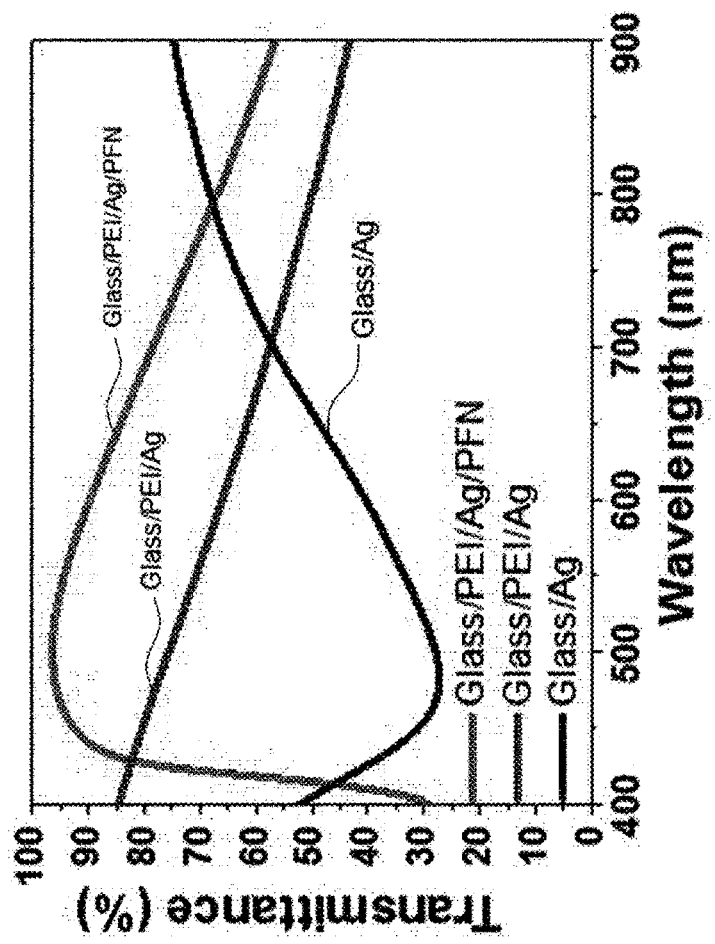
FIG. 7 shows a graph representing a light transmittance per wavelength for Ag, PEI/Ag, and PEI/Ag/PFN (poly[(9,9-bis(3'-(N,N-dimethylamino)propyl)-2,7-fluorene)-alt-2,7-(9,9dioctylfluorene)]) layered on the glass substrate, respectively.
Figure 8:
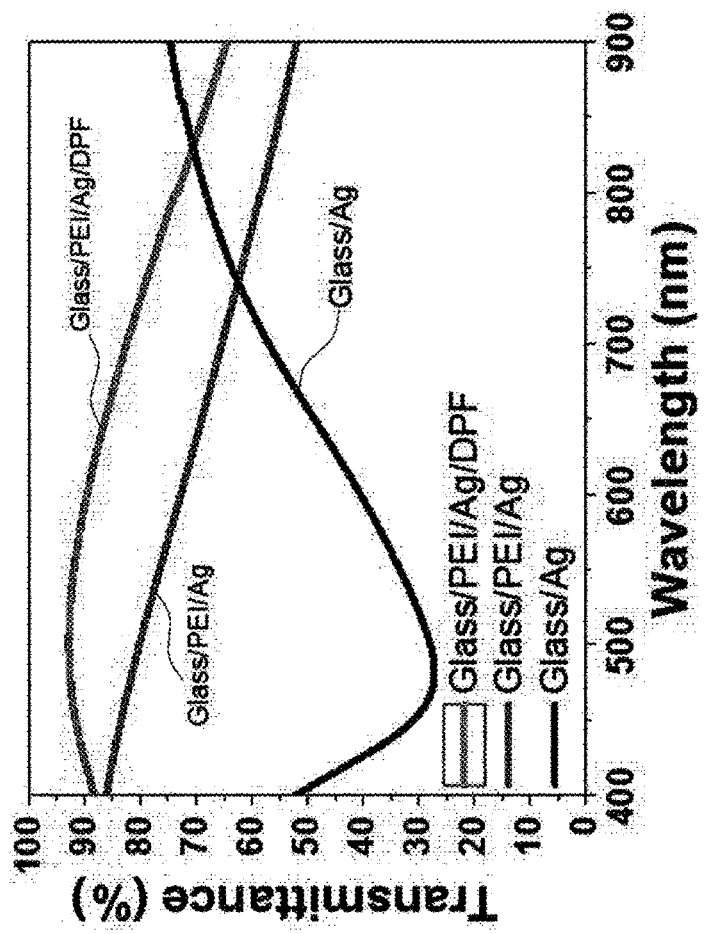
FIG. 8 shows a graph representing a light transmittance per wavelength for Ag, PEI/Ag, and PEI/Ag/DPF (diphenyl fluorene derivative) layered on the glass substrate, respectively.

Graphs representing transmittances of these electrodes are shown in FIGS. 4, 7, and 8. A plasmonic peak of "Comparative Electrode 1" is observed near 550 nm, and a light transmittance thereof is extremely low than that of each of "Inventive Electrode 1", "Inventive Electrode 2", "Inventive Electrode 3", and "Inventive Electrode 4." In addition, with a non-reflection or anti-reflection effect of the conductive polymer layer, the polyelectrolyte layer, and the monoelectrolyte layer, each of "Inventive Electrode 2", "Inventive Electrode 3", and "Inventive Electrode 4" shows the light transmittance higher than that of "Inventive Electrode 1."

The light transmittance and the sheet resistance of each of the electrodes are listed in Table 1.

TABLE 1

| Classification | Structure | Light Transmittance (%, @550 nm) | Sheet Resistance ($\Omega/\square$) |
|---|---|---|---|
| Comparative Electrode 1 | Glass/Ag | 34.6 | ∞ |
| Inventive Electrode 1 | Glass/PEI/Ag | 72.7 | 10.1 |
| Inventive Electrode 2 | Glass/PEI/Ag/PEDOT:PSS | 87.3 | 9.7 |
| Inventive Electrode 3 | Glass/PEI/Ag/PFN | 94.3 | 7.0 |
| Inventive Electrode 4 | Glass/PEI/Ag/DPF | 91.9 | 9.8 |

Figure 12:
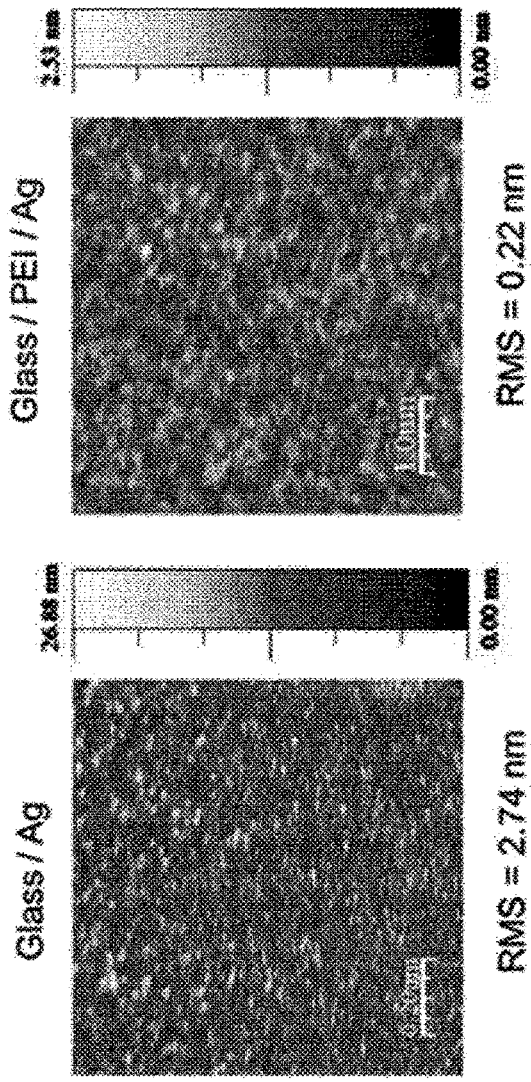
FIG. 12 is photographs measuring surface roughness for Ag and PEI/Ag layered on the glass substrate, respectively.

In FIG. 12, photographs for atomic force microscopy (AFM) measurements with respect to "Comparative Electrode 1" and "Inventive Electrode 1" are shown. In comparison with a surface roughness of a root mean square (RMS) of "Inventive Electrode 1" having 2.74 nm, "Comparative Electrode 1" has 0.22 nm such that it can be seen that the roughness is dramatically reduced. This result means that the surface roughness of the Ag thin film of "Inventive Electrode 1" is reduced to obtain a sleeker surface so that "Inventive Electrode 1" may be fully used as a transparent electrode, Also, sheet resistances of "Inventive Electrode 2", "Inventive Electrode 3", and "Inventive Electrode 4" are 9.7 $\Omega/\square$, 8.9$\Omega/\square$, and 9.8$\Omega/\square$, respectively, and each sheet resistance is similar to that of "Inventive Electrode 1." Transmittances of these electrodes at a wavelength of 550 nm are 87.3%, 98.7%, and 91.9%, respectively, and each transmittance is higher than over 20% compared to the transmittance of 72.7% of "Inventive Electrode 1." As described above, this result may be construed that a non-reflection or anti-reflection effect of the conductive polymer layer, the polyelectrolyte layer, and the monoelectrolyte layer is added to "Inventive Electrode 2", "Inventive Electrode 3", and "Inventive Electrode 4."

These results may satisfy an optical requirement (transmittance>85% @550 nm) and an electrical requirement (sheet resistance<15Ω/□) of a transparent electrode for a next generation flexible display.

3-2. Use of Polyethylene Naphthalate Substrate

In comparison with "Comparative Electrode 2" in which only the metal layer is formed on the PEN substrate, "Inventive Electrode 5" manufactured with the PEI and the metal (Ag) layered on the PEN substrate, "Inventive Electrode 6" manufactured with the conductive polymer layer (PEDOT:PSS) in addition to "Inventive Electrode 5", and "Inventive Electrode 7" manufactured with the polyelectrolyte layer in addition to "Inventive Electrode 5" have a low sheet resistance and a high transmittance.

Figure 5:
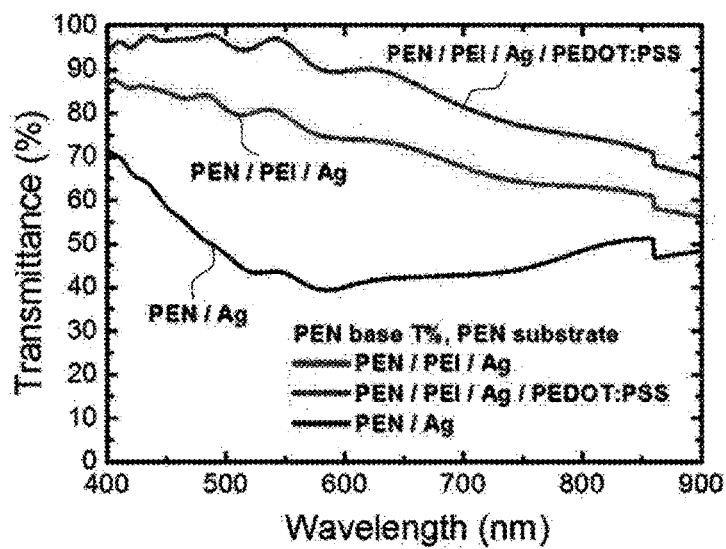
FIG. 5 shows a graph representing a light transmittance per wavelength for Ag, PEI/Ag, and PEI/Ag/PEDOT:PSS layered on a polyethylene naphthalate (PEN) substrate, respectively.
Figure 9:
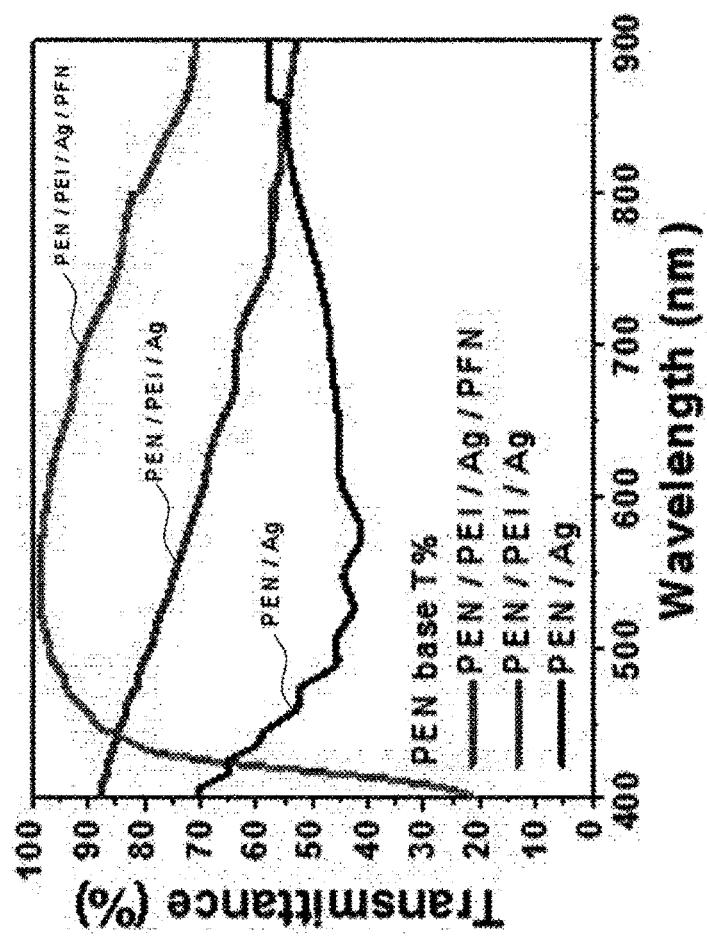
FIG. 9 shows a graph representing a light transmittance per wavelength for Ag, PEI/Ag, and PEI/Ag/PFN layered on the PEN substrate, respectively.

Graphs of transmittances for these electrodes are shown in FIGS. 5 and 9. "Comparative Electrode 2" has a light transmittance remarkably less than that of each of "Inventive Electrode 5", "Inventive Electrode 6", and "Inventive Electrode 7." Also, owing to addition of a non-reflection or anti-reflection effect of the conductive polymer layer and the polyelectrolyte layer, "Inventive Electrode 6" and "Inventive Electrode 7" show the light transmittances higher than the light transmittance of "Inventive Electrode 5."

Figure 6:
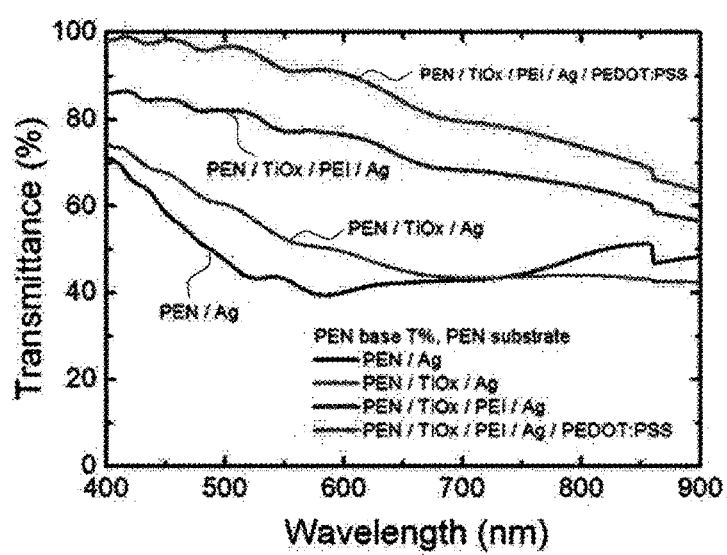
FIG. 6 shows a graph representing a light transmittance per wavelength for Ag, $TiO_x$/Ag, $TiO_x$/PEI/Ag, and $TiO_x$/PEI/Ag/PEDOT:PSS layered on the PEN substrate, respectively.

Additionally, light transmittances of "Comparative Electrode 2", "Comparative Electrode 3", "Inventive Electrode 10", and "Inventive Electrode 11" are shown in FIG. 6, and the light transmittances show similar patterns for "Inventive Electrode 5" and "Inventive Electrode 6."

The light transmittances and the sheet resistances for these electrodes are listed in Table 2.

TABLE 2

| Classification | Structure | Light Transmittance (%, @550 nm) | Sheet Resistance (Ω/□) |
|---|---|---|---|
| Comparative Electrode 2 | PEN/Ag | 43.2 | ∞ |
| Inventive Electrode 5 | PEN/PEI/Ag | 79.4 | 9.89 |
| Inventive Electrode 6 | PEN/PEI/Ag/PEDOT:PSS | 96.2 | 12.2 |
| Inventive Electrode 7 | PEN/PEI/Ag/PFN | 98.7 | 8.9 |
| Comparative Electrode 3 | PEN/TiO$_x$/Ag | 52.4 | 39.3 |
| Inventive Electrode 10 | PEN/TiO$_x$/PEI/Ag | 77.2 | 9.31 |
| Inventive Electrode 11 | PEN/TiO$x$/PEI/Ag/PEDOT:PS | 91.4 | 14.4 |

4. Manufacture of Organic Solar Cell

Figure 13:
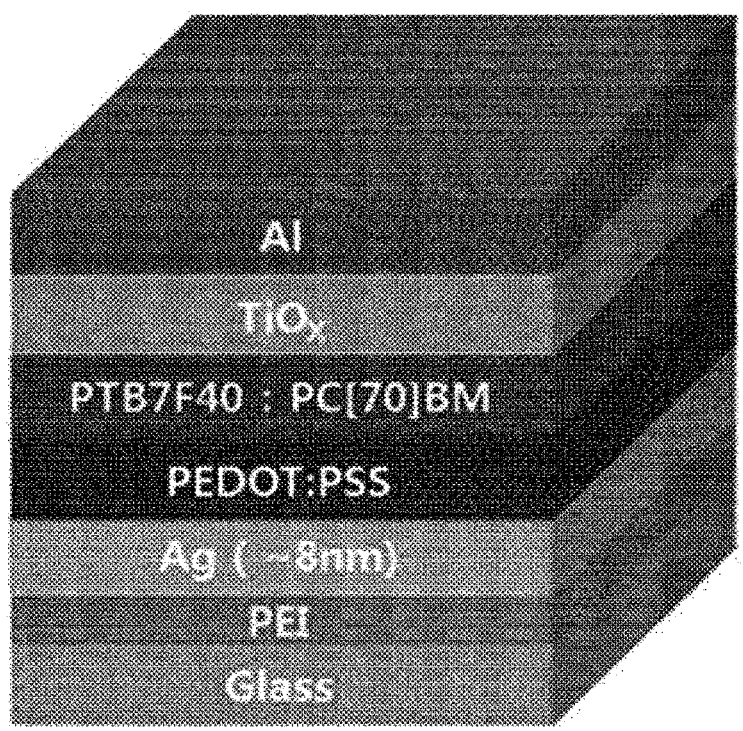
FIG. 13 is a structural diagram of a solar cell including the electrode according to one embodiment of the present invention.

By using "Inventive Electrode 2", a polymer solar cell (PSC) as a representative organic electronic device is manufactured. A structure of the PSC and substances used therein are shown in FIG. 13. The PSC is manufactured by coating a composite of a conjugated polymer PTB7-F40 (Poly (thieno[3,4-b]thiophene-alt-benzodithiophene) and a fullerene derivative PC[70]BM ([6,6]-phenyl C 71-butyricacid methyl ester) on "Inventive Electrode 2" and then coating a TiO$_x$ (Titanium Sub-oxide) thin film using the solution process to evaporate an Al metal on the TiO$_x$ thin film.

Figure 14:
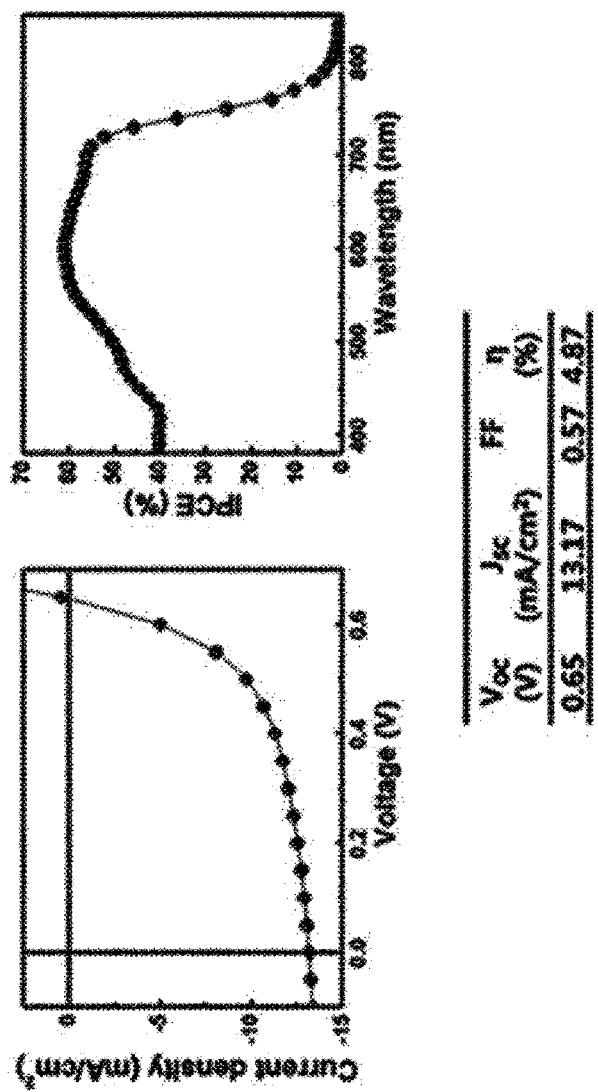
FIG. 14 is a graph illustrating a performance evaluation result of the solar cell including the electrode according to one embodiment of the present invention.

A performance of the manufactured PSC is shown in FIG. 14. The performances of an open-circuit voltage (VOC)=0.65 V, a short-circuit current (JSC)=13.17 mA/cm$^2$, a fill factor (FF)=0.57, and an efficiency (η)=4.87% are obtained. These results are comparable with those of a device manufactured by using an ITO transparent electrode.

5. Manufacture of Organic Light Emitting Diode

Figure 15:
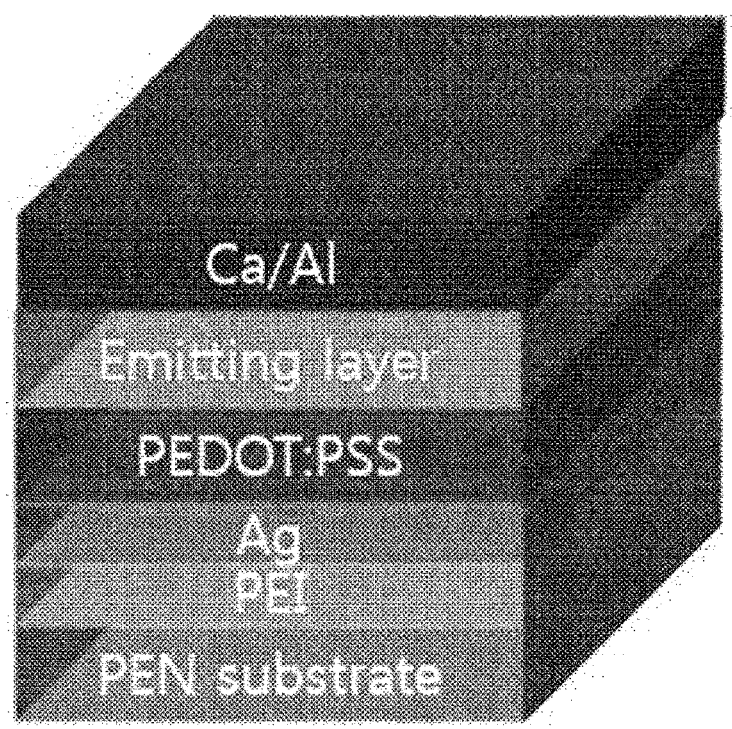
FIG. 15 is a structural diagram of an organic light emitting diode including the electrode according to one embodiment of the present invention.

By using "Inventive Electrode 6", a polymer light-emitting diode (PLED) as a representative organic electronic device is manufactured. A structure of the PLED is shown in FIG. 15. The PLED is manufactured by coating a light emitting layer (SPW-111, Merck KGaA Germany) on "Inventive Electrode 6" and sequentially evaporating metals of Ca and Al on the light-emitting layer.

Figure 16:
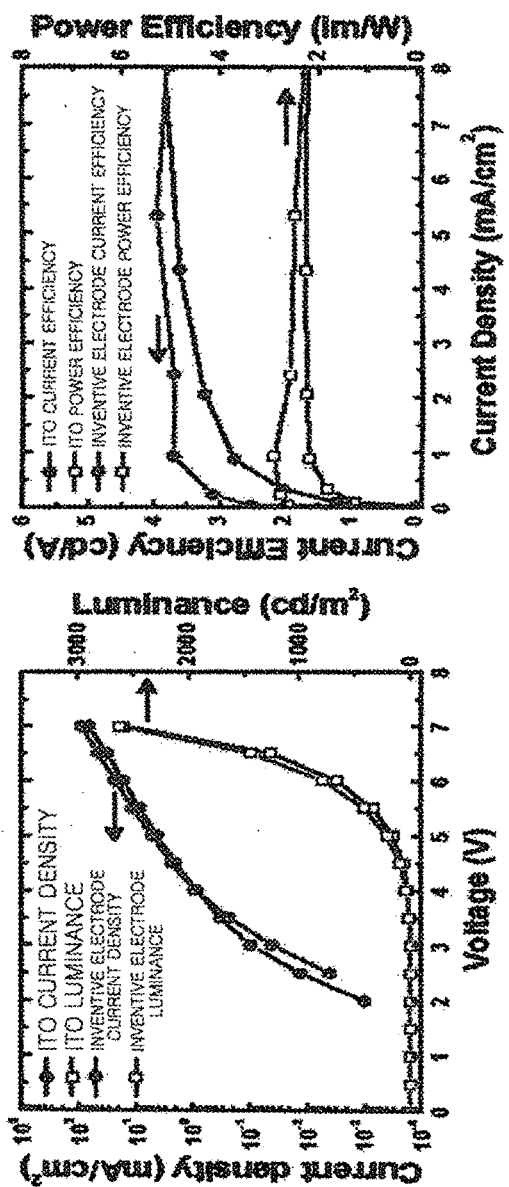
FIG. 16 is a graph representing a performance evaluation result of the organic light emitting diode including the electrode according to one embodiment of the present invention.

Performance test results of the manufactured PLED and an ITO transparent electrode are shown in FIG. 16.

A maximum brightness of 2626 cd/m$^2$ and a maximum efficiency of 3.95 cd/A are obtained. In comparison with a maximum brightness of 2585 cd/m$^2$ and a maximum efficiency of 3.92 cd/A of the device manufactured by using the ITO transparent electrode, the performances of the manufactured PLED is comparable with those of the ITO transparent electrode.

The invention claimed is:

1. An electrode having a light transmittance, the electrode comprising:
    a substrate;
    an amine group-containing compound layer contacted with the substrate; and
    a metal layer contacted with the amine group-containing compound layer,
    wherein the amine group-containing compound layer is disposed between the substrate and the metal layer.

2. The electrode of claim 1, further comprising:
    an anti-reflection layer contacted with the metal layer,
    wherein the amine group-containing compound layer, the metal layer, and the anti-reflection layer are laminated in sequence on the substrate.

3. An electrode having a light transmittance, the electrode comprising:
    a substrate;
    a metal oxide layer contacted with the substrate;
    an amine group-containing compound layer contacted with the metal oxide layer; and
    a metal layer contacted with the amine group-containing compound layer,
    wherein the metal oxide layer, the amine group-containing compound layer, and the metal layer are laminated in sequence on the substrate.

4. The electrode of claim 3, further comprising:
    an anti-reflection layer formed on the metal layer,
    wherein the metal oxide layer, the amine group-containing compound layer, the metal layer, and anti-reflection layer are laminated in sequence on the substrate.

5. The electrode of claim 1, wherein the substrate is
    an inorganic substrate selected from glass, quartz, Al.sub.2O.sub.3, SiC, Si, GaAs, and InP, or
    an organic substrate selected from Kepton foil, polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), and cellulose acetate propionate (CAP).

6. The electrode of claim 1, wherein the amine group-containing compound layer is alkylamine available for having substituents, cycloalkylamine available for having substituents, arylamine available for having substituents, polymer containing amine groups derived from these amines, or a combination of two or more polymers containing the amine groups.

7. The electrode of claim 1, wherein a metal of the metal layer is selected from Ag, Cu, Au, Al, Ce, Pr, Nd, Pm, Sm, Eu, Gd, Tb, Dy, Ho, Er, Tm, Yb, Lu, Sc, Ti, V, Cr, Mn, Fe, Co, Ni, Zn, Y, Zr, Nb, Mo, Tc, Ru, Rh, Pd, Cd, In, Sn, Hf, Ta, W, Re, Os, Ir, Pt, Tl, Pb, Bi, Ga, Ge, Sb, Ac, Th, and a combination thereof.

8. The electrode of claim 2, wherein the anti-reflection layer is made of one selected from polyaniline, polythiophene, polyethylenedioxythiophene (PEDOT), polyimide, polystyrenesulfonate (PSS), polypyrrole, polyacetylene, poly(p-phenylene), poly(p-phenylene sulfide), poly(p-phenylene vinylene), polythiophene poly(thienylene vinylene), poly(3,4-ethylenedioxythiophene)poly(styrenesulfonate) (PEDOT:PSS), and a combination thereof.

9. The electrode of claim 2, wherein the anti-reflection layer is made of one selected from poly[(9,9-bis(3'-(N,N-dimethylamino)propyl)-2,7-fluorene)-alt-2,7-(9,9-di-octyl-fluorene) (PFN), poly(9,9-bis(4'-sulfonatobutyl)(fluorine-alt-co-1,4-phenylene (PFP), poly(styrenesulfonic acid) (PSS), poly(p-quaterphenylene-2,2'-dicarboxylic acid), diphenyl fluorine derivative (DPF), tetrakis(1-imidazolyl) borate, Bim4-), and a combination thereof.

10. The electrode according to claim 3,
wherein said transparent electrode further comprises an anti-reflection layer contacted with the metal layer,
wherein the metal oxide layer, the amine group-containing compound layer, the metal layer, and the anti-reflection layer are laminated in sequence on the substrate.

11. A method of manufacturing a transparent electrode having a multilayer structure, the method comprising:

forming an amine group-containing compound layer on a substrate; and
forming a metal layer on the amine group-containing compound layer,
wherein
the formed amine group-containing compound layer is contacted with the substrate, and
the formed amine group-containing compound layer and the formed metal layer are laminated in sequence on the substrate.

12. The method of claim 11, further comprising:
forming an anti-reflection layer on the metal layer,
wherein the formed amine group-containing compound layer, the formed metal layer, and the formed anti-reflection layer are laminated in sequence on the substrate.

13. The method of claim 11, wherein the amine group-containing compound layer is formed through spin-coating, roll coating, spray coating, flow coating, ink-jet printing, nozzle printing, dip coating, electrophoretic deposition, tape casting, screen printing, pad printing, doctor blade coating, gravure printing, gravure offset printing, Langmuir-Blodgett process, sputter deposition, electron beam evaporation, thermal evaporation, or chemical vapor deposition.

14. The method of claim 11, wherein the metal layer is formed through an applying method by sputter deposition, electron beam evaporation, thermal evaporation, chemical vapor deposition, or a solution process.

15. The method of claim 12, wherein the anti-reflection layer is formed through spin-coating, roll coating, spray coating, flow coating, ink-jet printing, nozzle printing, dip coating, electrophoretic deposition, tape casting, screen printing, pad printing, doctor blade coating, gravure printing, gravure offset printing, Langmuir-Blodgett process, sputter deposition, electron beam evaporation, thermal evaporation, or chemical vapor deposition.

* * * * *

UNITED STATES PATENT AND TRADEMARK OFFICE
CERTIFICATE OF CORRECTION

PATENT NO. : 9,735,295 B2  
APPLICATION NO. : 15/027184  
DATED : August 15, 2017  
INVENTOR(S) : Kwang Hee Lee et al.

Page 1 of 1

It is certified that error appears in the above-identified patent and that said Letters Patent is hereby corrected as shown below:

On the Title Page

Item (73) "Assignee:" should read:  
ONES (Organic Nano Electronic System) Co., LTD (Gwangju, KR)

Signed and Sealed this  
Thirty-first Day of October, 2017

Joseph Matal  
*Performing the Functions and Duties of the*  
*Under Secretary of Commerce for Intellectual Property and*  
*Director of the United States Patent and Trademark Office*